United States Patent [19]
Ting

[11] 4,390,844
[45] Jun. 28, 1983

[54] INTEGRATION FILTER FOR STEP WAVEFORMS

[75] Inventor: Joseph W. Ting, Culver City, Calif.

[73] Assignee: California Institute of Technology, Pasadena, Calif.

[21] Appl. No.: 219,825

[22] Filed: Dec. 24, 1980

[51] Int. Cl.³ .......................... H03K 4/90; H03K 6/00
[52] U.S. Cl. .................................... 328/142; 328/127; 328/151; 307/228; 307/490
[58] Field of Search ................ 328/127, 151, 142, 143; 340/347 NT, 347 SH; 307/227, 228, 264, 490

[56] References Cited

U.S. PATENT DOCUMENTS

| | | | |
|---|---|---|---|
| 3,064,144 | 11/1962 | Hardy | 328/127 X |
| 3,156,899 | 11/1964 | Reich et al. | 340/347 SH |
| 3,184,685 | 5/1965 | Funk et al. | 328/37 X |
| 3,676,698 | 7/1972 | Hunter | 307/228 |
| 3,733,600 | 5/1973 | Hellwarth et al. | 340/347 NT |
| 3,749,942 | 7/1973 | Moses | 307/228 X |
| 4,276,860 | 7/1981 | Capurka | 307/228 X |

OTHER PUBLICATIONS

Pulse, Digital & Switching Waveforms by Millman & Taub Copyright 1965 pp. 43-46.

Primary Examiner—John S. Heyman
Attorney, Agent, or Firm—Freilich, Hornbaker, Wasserman, Rosen & Fernandez

[57] ABSTRACT

A method and apparatus for converting an input step waveform signal into a smooth output waveform signal is comprised of two sample-and-hold circuits (11, 12), one for sampling each step of the input signal and the other for synchronously sampling and holding the output waveform, a circuit (17-20) for providing a signal proportonal to the difference between the samples held in the sample-and-hold circuits, and means (21-23) for integrating the difference. The output of the integrator is connected to the second sample-and-hold circuit while the step waveform to be filtered is connected to the input of the first sample-and-hold circuit. The integrator thus produces an output that is a linear signal during each clock pulse period with a slope equal the sign and amplitude of each step.

7 Claims, 3 Drawing Figures

INTEGRATION FILTER FOR STEP WAVEFORMS

BACKGROUND OF THE INVENTION

This invention relates to a method and apparatus for filtering step waveforms, and more particularly to a circuit for filtering a step waveform of the type which changes value in synchronism with a clock pulse, such as the step waveform output of a digital-to-analog converter.

In most systems which utilize a step waveform, it is necessary, or at least desirable, to filter the step waveform in order to provide a smooth analog signal. Typical examples are waveform simulators of digital-to-analog converters for servo control systems. The filter commonly used is a simple low-pass filter. The trouble with such a simple solution to the problem of smoothing a step waveform is that the low-pass filter tends to introduce high frequency harmonic distortions and undesired phase shifts in the resulting analog signal. What is desired is a filter that is more predictable and more precise for smoothing the output of waveform simulators, digital-to-analog converters, sample-and-hold circuits, CCD (charge coupled device) analog delay lines, and the like.

The application of the present invention to the problem of filtering the output of digital-to-analog converters per se is particularly significant. During the course of the last few years, the importance of analog-to-digital and digital-to-analog converters has increased together with the proliferation of microprocessors and small computers. The reason is that they are necessary interfacing blocks between the chiefly analog nature of the world and the realm of the digital processing that takes place in the microprocessors and small computers.

The digital-to-analog converters can be broadly classified into two main categories, depending on their application. One class of such converters are for use as precision reference sources where their outputs do not change rapidly with time. The other class is for converters used as reproducers of analog waveforms by successions of step functions with considerably higher harmonics in their frequency content. The usual practice is, as noted above, to smooth the outputs through a low-pass filter. However, the resulting waveforms depend on the nature of the low-pass filter, on the rate of change in one clock period which can cause distortions, such as amplitude attenuations and phase shifts, as noted hereinbefore.

SUMMARY OF THE INVENTION

In accordance with the present invention, a waveform is provided for converting the voltage of each of the steps of a step waveform into a linear segment that has a slope equal to the change in voltage over the next step period, such as in smoothing a step waveform at the output of an analog-to-digital converter. The apparatus for carrying out the process is comprised of first and second sample-and-hold circuits synchronously operated in response to clock pulses. The output of the second sample-and-hold circuit is combined with the output of the first by means for producing a signal equal to the difference between the voltage signals sampled and held by the two circuits. The difference is integrated from one clock pulse to the next in an integrator circuit. The integrator output, which constitutes the filter output, is connected to the input of the second sample-and-hold circuit. In that manner, the integrator circuit will integrate the difference between two adjacent steps and thus provide as an output a linear segment during each clock pulse period with a slope equal to the sign and amplitude of each step of the step waveform, thereby smoothing the step waveform into a more ideal analog waveform with only one to two sampling periods delay.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
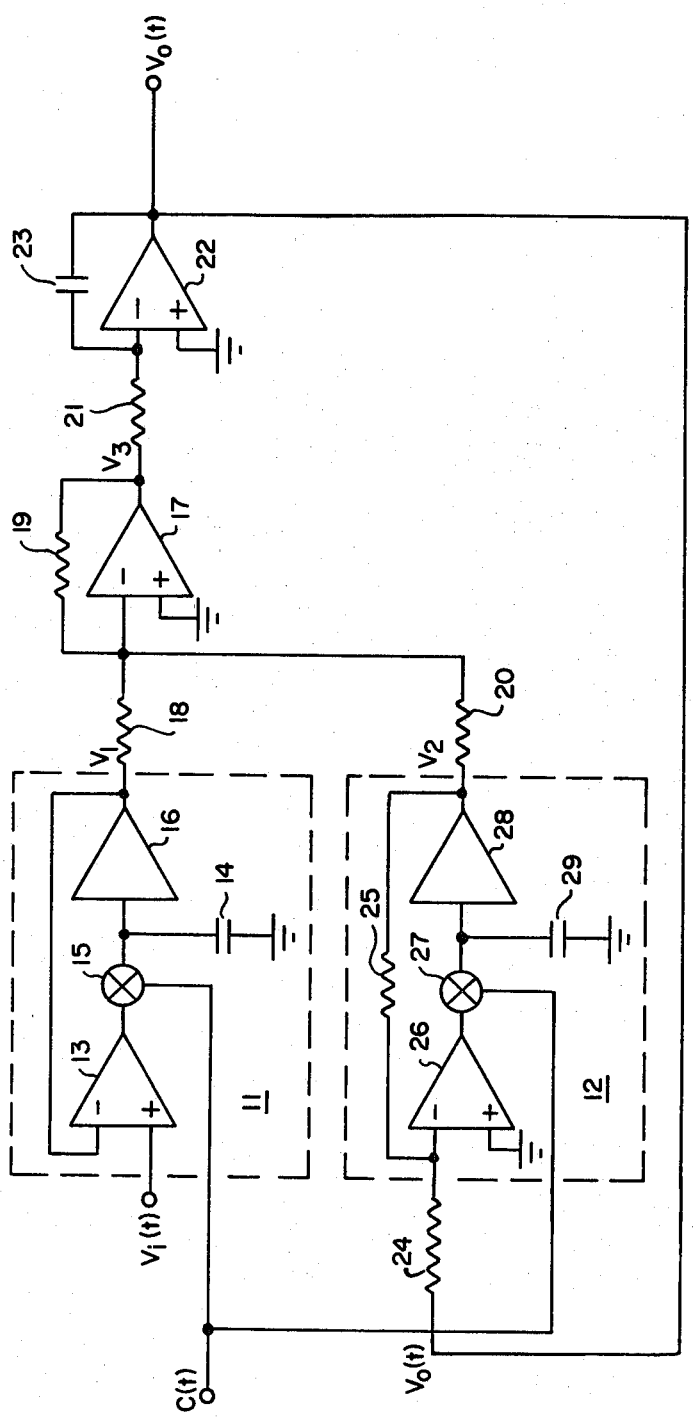
FIG. 1 is a circuit diagram of an exemplary embodiment of the invention.

Referring now to FIG. 1 of the drawings, a filter for a step waveform is comprised of two sample-and-hold circuits 11 and 12. While such circuits may be implemented from an analog switch, a holding capacitor, and an operational amplifier, the successful practice of the invention requires a high quality circuit in which the holding capacitor charges to its final value and settles quickly, with near zero leakage current at the capacitor. The problems of circuit design are mostly with the analog switches, which must have very low coupling between the digital input and analog output. Other problems are with the operational amplifier which must have extremely low bias current, low offset drift and sufficient slew rate. A monolithic integrated circuit having an electronic analog switch isolated from the input and the output by operational amplifiers is therefore preferred. Such a monolithic circuit is commercially available from the Semiconductor Products Division of Harris Corporation (model HA-2420/2425 monolithic sample-and-hold/gated operational amplifier). The following description of the circuit 11, used as a unity gain, noninverting sample-and-hold circuit, will apply to that monolithic circuit. The circuit 12 is identical, but used as a unity gain, inverting sample-and-hold circuit. Other monolithic circuits having the same characteristics could, of course, be used.

An input amplifier 13 is a high performance operational amplifier with excellent slew rate, and the ability to drive a holding capacitor 14 through a series switch 15 without instability. The switch is a highly efficient bipolar transistor with extremely low leakage in the off condition. An output buffer amplifier 16 is a unity gain follower with a high impedance (MOSFET) input stage to operate with extremely low current. Any offset voltage drift of the MOSFET input stage is corrected by negative feedback from the output of the amplifier 16 to the input of the amplifier 13. While the switch 15 is turned on, the circuit functions as a conventional operational amplifier able to drive capacitive loads, and while the switch 15 is turned off, the node between the switch 15 and amplifier 13 is an almost perfect open circuit and the voltage stored in the capacitor 14 will be presented at the output of the buffer amplifier 16. The step waveform signal, $V_i(t)$, is applied as an input at the positive input terminal of the operational amplifier 13, and is reproduced at the output terminal of the buffer amplifier 16 at every clock pulse.

An operational amplifier 17 is connected as a voltage adding circuit to the output of the sample-and-hold circuit 11 by a summing resistor 18. Current in a feedback resistor 19 is the algegraic sum of the current due to the voltage $V_1$ at the output of the sample-and-hold circuit 11 and the current due to the voltage $V_2$ at the output of the circuit 12 coupled to the summing junction by a resistor 20. The output voltage $V_3$ of the adding circuit is equal to the algebraic sum of the input voltages, times a scaling factor equal to the ratio of the feedback resistor 19 to the input resistors 18 and 20, such as 1.0 in the example illustrated.

The output voltage $V_3$ is coupled by a resistor 21 to an integrator comprised of an operational amplifier 22 and a feedback capacitor 23. The output of the integrator provides an output signal $V_o(t)$ which is a linear voltage signal during each sample period with a slope equal to the difference in voltage between adjacent samples, as will be better appreciated from the following description of the filter operation with reference to FIGS. 2 and 3. But first it should be noted that the output signal $V_o(t)$ is coupled to the sample-and-hold circuit 12 by a resistor 24 which, as noted hereinbefore is like the circuit 11 but connected as an inverting sample-and-hold circuit by a feedback resistor 25 to the negative input of an operational amplifier 26 to which the output signal $V_o(t)$ is coupled. An electronic switch 27 is operated by the same clock pulses applied to the sampling switch 15 of the circuit 11. A noninverting buffer amplifier 28 thus provides the output voltage $V_2$ which is the sample of the output signal $V_o(t)$, but inverted. This sample of the output is taken at the instant a new sample of the input voltage is taken, so at all times the output signal $V_o(t)$ is the integrated difference between a new sample $V_1$ and the sample $V_2$ of the integrated output.

It should be recognized that connecting the circuit 12 as an inverting sample-and-hold circuit permits forming the difference $V_1-V_2$ by adding the voltages $+V_1$ and $-V_2$. It would be possible to connect the circuit 12 as a noninverting sample-and-hold circuit, and to form the difference by subtracting the voltage $+V_2$ from the voltage $V_1$ using a differential operational amplifier, but the arrangement shown is preferred because it is independent of the input common mode characteristics of the operational amplifier 17.

Figure 2:
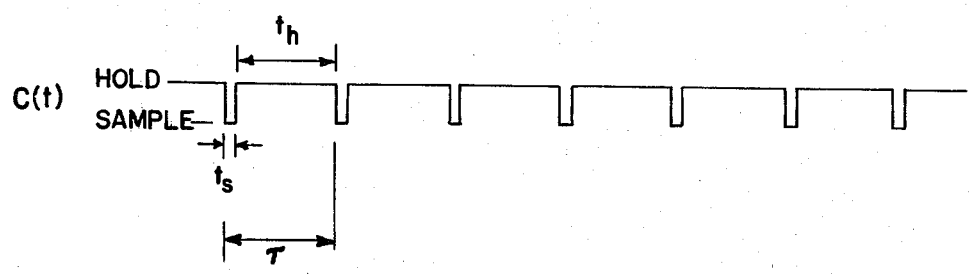
FIG. 2 illustrates a sampling command signal for the circuit of FIG. 1.

Operation of the integration filter shown in FIG. 1 will now be described with reference to FIGS. 2 and 3. In the following discussion, let all the continuous time variable parameters be designated by subscripts (t) and the DC components (within one clock period) by (tn) where n is any integer. C(t) is the sampling command (clock pulse) signal shown in FIG. 2. $\tau$ is the clock pulse period. The sampling time, $t_s$, is very narrow compared to the holding time $t_h$.

Given the time variable input voltage $V_i(t)$, the sample-and-hold circuit 11 will store this voltage at the instant $t_1$.

$$V_1 = V_i(t_1) \quad (1)$$

At the same instant, the sample-and-hold circuit 12 will store the inverted output voltage $-V_o(t_i)$.

$$V_2 = -V_o(t_1) \quad (2)$$

The summing amplifier 17 performs the algebraic addition of these two voltages, and inverts the sum.

$$V_3 = -(V_1+V_2) = -V_i(t_1)+V_o(t_1) \quad (3)$$

The voltage $V_3$, on its turn, is the input (multiplier) to the integrator 22.

$$V_o(t) = -\frac{V_3}{RC} \int_{t_1}^{t_1+\tau} dt + V_o(t_1)$$

Where RC is the integrating time constant equal to the product of the resistance and capacitance of resistor 21 and capacitor 23.

$$V_o(t) = -\frac{V_3}{RC} t \Big|_{t_1}^{t_1+\tau} + V_o(t_1) \quad (4)$$

$$= -\frac{V_2}{RC}\tau + V_o(t_1)$$

where $V_o(t_1)$ is the output of the integrator at the instant $t_1$.

The RC time constant of the integrator is chosen to be equal to the period $\tau$. Therefore, at the end of one period that is at the instant $t_1+\tau$, the integrator will slew exactly the voltage $V_3$.

$$V_o(t_1+\tau) = -\frac{V_3}{\tau}\tau + V_o(t_1) \quad (5)$$

Substituting equation 3 into equation 5, $$V_o(t_1+\tau) = +V_i(t_1)-V_o(t_1)+V_o(t_1) \quad (6)$$

which is the same as:
$$V_o(t_1) = V_i(t_1-\tau) \quad (7)$$

Figure 3:
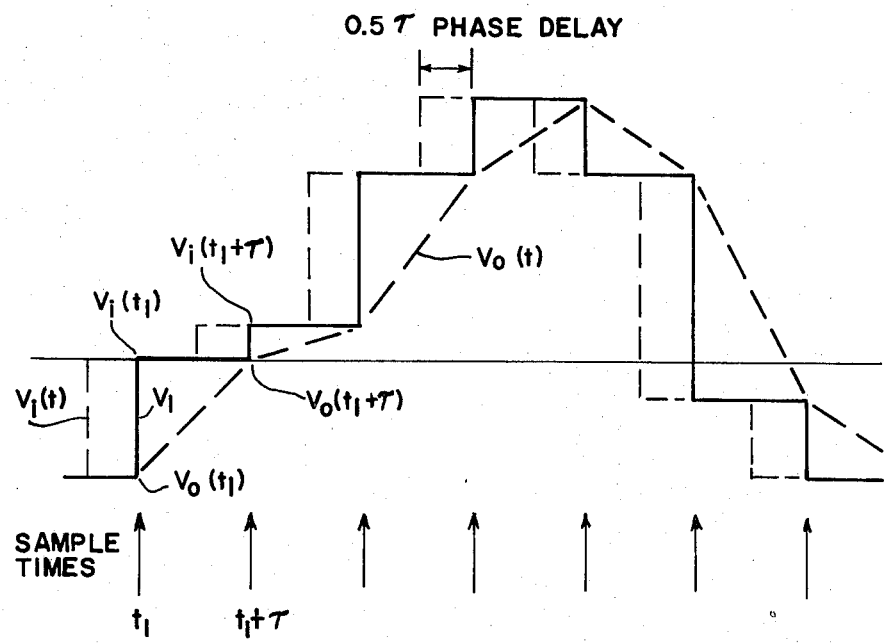
FIG. 3 illustrates a typical step waveform to be smoothed by the circuit of FIG. 1 and the smoothed output.

Equation 7 shows that at the end of one clock period, the integrator would have reached the input voltage of the previous period in the step waveform shown in FIG. 3.

The integration filter yields a very predictable and elegant solution to filtering any realizable step waveform. Note that the output $V_o(t)$ follows the input $V_i(t)$ with only predictable phase delay, which corresponds to when the clock command is applied, and no amplitude distortion from sample to sample. The feedback through the circuit 12 and resistor 20 will guarantee convergent accuracies for precision applications. That feedback tends to cancel all initial errors and subsequent drifts in the circuit.

The acquisition time of the sample-and-hold circuit 12 must be small compared to the clock period, $\tau$. For first approximation, it could be made 0.001 of $\tau$ if 0.1% accuracies are to be expected for waveforms of maximum transition in one clock period. For precision, the circuit 12 may include two analog switches, with one of them used to balance out the MOSFET charge injection errors of the buffer amplifier 28 during the switching. For acquisition times below one microsecond, an ultra fast diode bridge sample-and-hold circuit might be used instead of the circuit 12 shown.

It should now be apparent that the present invention provides a smoothing filter for step waveform without distortion and the maximum of only two clock periods delay between the input $V_i(t)$ and the output $V_o(t)$. The only critical components are the resistor 21 and capacitor 23. The capacitor has to have a low dielectric absorption constant and high stability over temperature and time, such as a teflon capacitor. The time constant of those integrating components should not deviate from $\tau$ since any deviation will cause instabilities similar to normal feedback circuits. Other component deviations will cause only gain or offset changes from the desired design values. For instance, if the resistor 19 is selected to be 5K, while the resistors 18 and 20 are selected to be 10K, the voltage adding circuit will have a gain of 0.5 instead of 1.0. In some cases it may be desirable to have a gain of only 0.5 for the amplifier 17 if the sum $V_1+V_2$ could be expected to saturate the amplifier 17. The loss in signal amplitude is then restored by increasing the gain of the integrator by providing an RC time constant equal to $\tau/2$. The purpose for this is to optimize the dynamic range of the filter. Any deviation will simply change that gain factor, which will only change the gain between the input and the output. For unity gain in the inverting sample-and-hold circuit 12, the resistors 24 and 25 must be equal, such as 10K. The values of capacitance for the capacitors 14 and 29 of the sample-and-hold circuits 11 and 12 are not critical. It is only important that the capacitors be chosen to have a low dielectric constant, as noted above. The larger the values, the longer the holding period, $t_h$, of the capacitors without excessive drift, but they must be kept small enough to be charged during the sampling periods, $t_s$. The capacitance value must therefore be selected for the holding and sampling periods $t_h$ and $t_s$ of each application. Assuming $t_h=1$ ms, and $t_s=6$ μs, an optimum value for the capacitance of these holding capacitors is 1000 pF. For the component values chosen in the example of gain of operational amplifier 17 equal 0.5, $RC=\tau/2=500$ μs. If $C=10,000$ pF, then $R=50$ kohms.

Although particular embodiments of the invention have been described and illustrated herein, it is recognized that modifications and variations may readily occur to those skilled in the art. Consequently, it is intended that the claims be interpreted to cover such modifications and equivalents.

What is claimed is:

1. A method for smoothing a multistep waveform of an electrical signal by converting each step thereof into a perfectly linear segment over the next step period, each segment extending from the voltage at the end of the preceding step to the voltage at the beginning of the next step whereby said linear segment for each step has a potential difference between its beginning and its end voltages equal to the step change in potential.

2. A method for smoothing a multistep waveform of an electrical signal by converting each step thereof into a linear segment over the next step period, each segment extending from the voltage at the end of one preceding step to the voltage at the beginning of the next step, including the steps of sampling the input waveform voltage of each step, and storing each new sample of the input waveform until the next step, comparing each new sample thus stored with a sampled voltage substantially equal to the input waveform signal of the previous step to obtain a difference voltage, integrating said difference voltage to produce an output voltage signal that is a linear segment, sampling said output voltage step and storing each output voltage sample as a measure of the previous step voltage for comparison with each new step sample stored.

3. A method as defined in claim 2 wherein said new samples and output voltage samples are taken synchronously at the beginning of each step of said input waveform.

4. Apparatus for smoothing an input step waveform signal by converting it into an output waveform having linear segments extending from the voltage of each step to the voltage of the next step with a slope equal to the change in voltage over the next step period, each segment extending from the voltage of one step to the voltage of the next step, comprising first and second sample-and-hold circuit synchronously operated in response to clock pulses, said first sample-and-hold circuit being connected to sample and hold said input step waveform and said second sample-and-hold circuit being connected to sample and hold said output waveform, means for comparing samples held by said first and second sample-and-hold circuits to produce a signal proportional to the difference between samples held from one clock pulse to the next, means for integrating said difference signal to produce said output waveform at the output thereof.

5. Apparatus as defined in claim 4 wherein said second sample-and-hold circuit includes means for inverting the polarity of each output waveform, and wherein said comparing means is comprised of an adding circuit for producing the algebraic sum of each input waveform sample and inverted output waveform sample.

6. Apparatus for converting an input step waveform signal into a smooth output waveform signal comprising two sample-and-hold circuits, one for sampling and holding each step of the input signal and the other for synchronously sampling and holding the output waveform, circuit means for providing a signal proportional to the difference between the samples held in the sample-and-hold circuits, and means for integrating said difference to produce said smooth output waveform at the output thereof.

7. Apparatus as defined in claim 6 wherein said first sample-and-hold circuit is noninverting, and said second sample-and-hold circuit is inverting, and said circuit means for providing said difference is an adding circuit comprised of an operational amplifier having a feedback amplifier from its output to its inverting input and two summing resistors of equal resistance values coupling the input and output waveform samples to the inverting input terminal of said operational amplifiers.

* * * * *

UNITED STATES PATENT AND TRADEMARK OFFICE
CERTIFICATE OF CORRECTION

PATENT NO. : 4,390,844
DATED : June 28, 1983
INVENTOR(S) : Joseph W. Ting

It is certified that error appears in the above-identified patent and that said Letters Patent are hereby corrected as shown below:

Col. 1, line 14, delete "of" and substitute - - or - -

Column 1, line 64, delete "The" and substitute - - That - -

Col. 5, line 39, delete "Althugh" and substitute - - Although - -

Signed and Sealed this

Twenty-seventh Day of September 1983

[SEAL]

Attest:

GERALD J. MOSSINGHOFF

Attesting Officer

Commissioner of Patents and Trademarks